(12) United States Patent
Murata et al.

(10) Patent No.: US 10,325,794 B2
(45) Date of Patent: Jun. 18, 2019

(54) PURGE DEVICE AND PURGE METHOD

(71) Applicant: MURATA MACHINERY, LTD., Kyoto-shi, Kyoto (JP)

(72) Inventors: Masanao Murata, Ise (JP); Takashi Yamaji, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 375 days.

(21) Appl. No.: 15/117,215

(22) PCT Filed: Mar. 9, 2015

(86) PCT No.: PCT/JP2015/056820
§ 371 (c)(1),
(2) Date: Aug. 8, 2016

(87) PCT Pub. No.: WO2015/166710
PCT Pub. Date: Nov. 5, 2015

(65) Prior Publication Data
US 2016/0358799 A1 Dec. 8, 2016

(30) Foreign Application Priority Data
Apr. 28, 2014 (JP) .................................. 2014-092860

(51) Int. Cl.
*F26B 5/04* (2006.01)
*H01L 21/673* (2006.01)
*H01L 21/677* (2006.01)

(52) U.S. Cl.
CPC .. *H01L 21/67389* (2013.01); *H01L 21/67373* (2013.01); *H01L 21/67393* (2013.01); *H01L 21/67769* (2013.01)

(58) Field of Classification Search
CPC ......... H01L 21/67389; H01L 21/67769; H01L 21/67373; H01L 21/67393
USPC .................................................... 34/413, 417
See application file for complete search history.

(56) References Cited

U.S. PATENT DOCUMENTS

| 5,988,233 | A | 11/1999 | Fosnight et al. | |
|---|---|---|---|---|
| 6,542,220 | B1 * | 4/2003 | Schrijver | G03F 7/70716 355/53 |
| 7,360,346 | B2 * | 4/2008 | Miyajima | H01L 21/67017 141/1 |
| 8,591,809 | B2 * | 11/2013 | Ra | H01L 21/67389 141/63 |
| 9,305,817 | B2 * | 4/2016 | Kaise | H01L 21/67772 |

(Continued)

FOREIGN PATENT DOCUMENTS

JP 2007-005604 A 1/2007

*Primary Examiner* — John P McCormack
(74) *Attorney, Agent, or Firm* — Keating & Bennett, LLP

(57) ABSTRACT

A purge device includes a supply flow rate adjuster, which adjusts a supply flow rate of a purge gas supplied to a storage container through a supply pipe, and an intake flow rate adjuster, which adjusts an intake flow rate of the purge gas taken in from an inside of the storage container through a discharge pipe to prevent the pressure of the inside of the storage container from becoming negative relative to an outside of the storage container. The supply flow rate adjuster adjusts the supply flow rate in at least two stages including a first flow rate and a second flow rate that is higher than the first flow rate. When the supply flow rate is the first flow rate, the intake flow rate adjuster sets the intake flow rate to zero.

4 Claims, 5 Drawing Sheets

(56) References Cited

U.S. PATENT DOCUMENTS

| | | | | |
|---|---|---|---|---|
| 2006/0288664 A1* | 12/2006 | Okabe | ............... | H01L 21/67393 53/510 |
| 2010/0000625 A1* | 1/2010 | Goto | ................. | H01L 21/67389 141/4 |
| 2015/0371832 A1* | 12/2015 | Yanai | ................ | H01L 21/67028 438/714 |
| 2015/0380288 A1* | 12/2015 | Hirano | .............. | H01L 21/67379 438/597 |

* cited by examiner

PURGE DEVICE AND PURGE METHOD

BACKGROUND OF THE INVENTION

1. Field of the Invention

The present invention relates to a purge device and a purge method of performing a purge process in which an inside of a storage container, where an article is accommodated, is purged with a purge gas such as an inert gas or clean dry air.

2. Description of the Related Art

A purge device that maintains cleanliness by injecting a purge gas into the inside of a storage container, in which an article such as a semiconductor wafer or a glass substrate is accommodated, (that is, performing a so-called purge process) has been known. The purge process with such a purge device is performed in a sealed area, for example, in a purge stocker where a large amount of the purge gas is used. In order to reduce or prevent the purge gas with such a concentration that requires certain measures from discharging into the inside of this sealed area and eventually discharging from this sealed area to the outside of the sealed area, for example, as described in Japanese Patent Application Laid-Open Publication No. 2007-5604, a discharge pipe is connected to an outlet of the purge gas in the storage container and the purge gas is recovered via the discharge pipe. In the purge device with such a structure, there is not sufficient pressure to discharge the purge gas into the discharge pipe, so that the purge gas is forcibly sucked in and recovered by connecting the existing intake means or the like.

However, in the aforementioned structure, for example, if the amount of the purge gas taken in from the storage container becomes greater than the amount of the purge gas supplied to the storage container, there is a risk of rendering the pressure of the inside of the storage container negative relative to the outside of the storage container. In this case, for example, contaminated air and/or dust, or the like may be sucked in from an inlet of the purge gas or a space between a main body and a lid of the storage container, and this is not desirable.

SUMMARY OF THE INVENTION

Thus, preferred embodiments of the present invention provide a purge device and a purge method of reducing an amount of a purge gas leaking into a sealed area where the purge device is placed even when a flow rate of the purge gas supplied to a storage container has been arbitrarily set and changed, and also preventing contaminated air and/or dust from being sucked into an inside of the storage container.

According to a preferred embodiment of the present invention, a purge device performs a purge process in which an inside of a storage container, where an article is accommodated, is purged with a purge gas, and includes a supply pipe that supplies the purge gas into the storage container by being connected to the storage container; a supply flow rate adjuster that adjusts the supply flow rate of the purge gas supplied to the storage container through the supply pipe; a discharge pipe that discharges the purge gas of the inside of the storage container by being connected to the storage container; and an intake flow rate adjuster that adjusts the intake flow rate of the purge gas taken in from the inside of the storage container through the discharge pipe to prevent the pressure of the inside of the storage container from becoming negative relative to the outside of the storage container. The supply flow rate adjuster is able to adjust the supply flow rate in at least two stages including a first flow rate and a second flow rate that is higher than the first flow rate. When the supply flow rate is the first flow rate, the intake flow rate adjuster sets the intake flow rate to zero.

According to a preferred embodiment of the present invention, a purge method is a method of performing a purge process such that an inside of a storage container, in which an article to be accommodated is accommodated, is purged with a purge gas, and includes a supply flow rate adjustment step, where a supply flow rate of the purge gas supplied to the storage container is adjusted; and an intake flow rate adjustment step, where an intake flow rate of the purge gas taken in from the inside of the storage container is adjusted in order to prevent the pressure of the inside of the storage container from becoming negative relative to the outside of the storage container. In the supply flow rate adjustment step, the supply flow rate is adjusted in at least two stages: a first flow rate and a second flow rate that is higher than the first flow rate. In the intake flow rate adjustment step, when the supply flow rate is the first flow rate, the intake flow rate is adjusted to zero.

According to the purge device with the above-described structure and the above-described purge method, as the purge gas of the inside of the storage container is taken in from the discharge pipe, the amount of the purge gas leaking from a section other than an outlet to which the discharge pipe is connected in the storage container is significantly reduced or prevented. In addition, according to the purge device with such a structure, the intake flow rate is adjusted in order to prevent the pressure of the inside of the storage container from becoming negative relative to the outside of the storage container. This prevents contaminated air and dust from being sucked into the inside of the storage container from the outside of the storage container. This significantly reduces the amount of the purge gas leaking into the sealed area where the purge device is placed and also prevents contaminated air and dust from being sucked into the inside of the storage container.

Furthermore, according to the purge device with such a structure, the supply flow rate of the purge gas supplied to the storage container is able to be arbitrarily set and changed, so that the purge gas is able to be supplied to the storage container in various patterns. If the supply flow rate is relatively low even in the case that the supply flow rate of the purge gas has been changed, the intake flow rate will be set to zero. This ensures that there is no possibility of the pressure of the inside of the storage container becoming negative relative to the outside of the storage container.

As a result of earnest examination, the inventors of the present application discovered that when taking in the purge gas from the inside of the storage container, the pressure of the inside of the storage container becomes negative relative to the outside of the storage container if the flow rate of the purge gas supplied to the storage container becomes lower than the predetermined flow rate despite the purge process being performed, that is, the purge gas being supplied to the storage container.

Thus, in a preferred embodiment of the present invention, the following settings of the first flow rate and the second flow rate may be made for the storage container that has a risk of rendering the pressure of the inside of the storage container negative relative to the outside of the storage container when the flow rate of the purge gas supplied to the storage container becomes lower than the predetermined flow rate at the time of being connected to the supply pipe and the discharge pipe. That is, the first flow rate is set as the predetermined flow rate or lower, and the second flow rate is set higher than the predetermined flow rate.

According to the purge device with such a structure, even when the flow rate of the purge gas supplied to the storage container has been changed, the intake flow rate of the purge gas taken in from the inside of the storage container is changed through the discharge pipe in order to prevent the pressure of the inside of the storage container from becoming negative relative to the outside of the storage container.

Additionally, in a preferred embodiment of the present invention, the intake flow rate adjuster includes a valve that is provided in the discharge pipe and an intake flow rate controller that controls opening and closing the valve. The intake flow rate controller may control so as to close the valve when the supply flow rate is the first flow rate and open the valve when the supply flow rate is the second flow rate.

According to the purge device with such a structure, it is possible to change the intake flow rate of the purge gas taken in from the inside of the storage container by using a relatively simple structure.

Additionally, in a preferred embodiment of the present invention, a discharge device may be further included which discharges the purge gas leaked from the section other than the outlet, which the discharge pipe is connected to in the storage container, to the outside of the storage container.

In the purge device with such a structure, when a low flow rate of the purge gas is supplied, the intake flow rate adjuster controls the intake flow rate, for example, by closing the valve to prevent the pressure of the inside of the storage container from becoming negative relative to the pressure of the outside. In this case, the purge gas may leak from the section other than the outlet in the storage container. In the purge device with such a structure, the discharge device is able to recover and discharge the purge gas leaked from the section other than the outlet, so that the leakage of the purge gas from the area where the purge device is placed is significantly reduced or prevented.

According to various preferred embodiments of the present invention, even when the flow rate of a purge gas supplied to a storage container has been arbitrarily set and changed, the amount of the purge gas leaking into a sealed area where a purge device is placed is significantly reduced and also contaminated air and dust is prevented from being sucked into the inside of the storage container.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be explained hereinafter with reference to the drawings. In the description of the drawings, the same reference signs are given to the same elements to omit duplicated explanation. The dimension ratio of the drawings does not always match each other.

Figure 1:
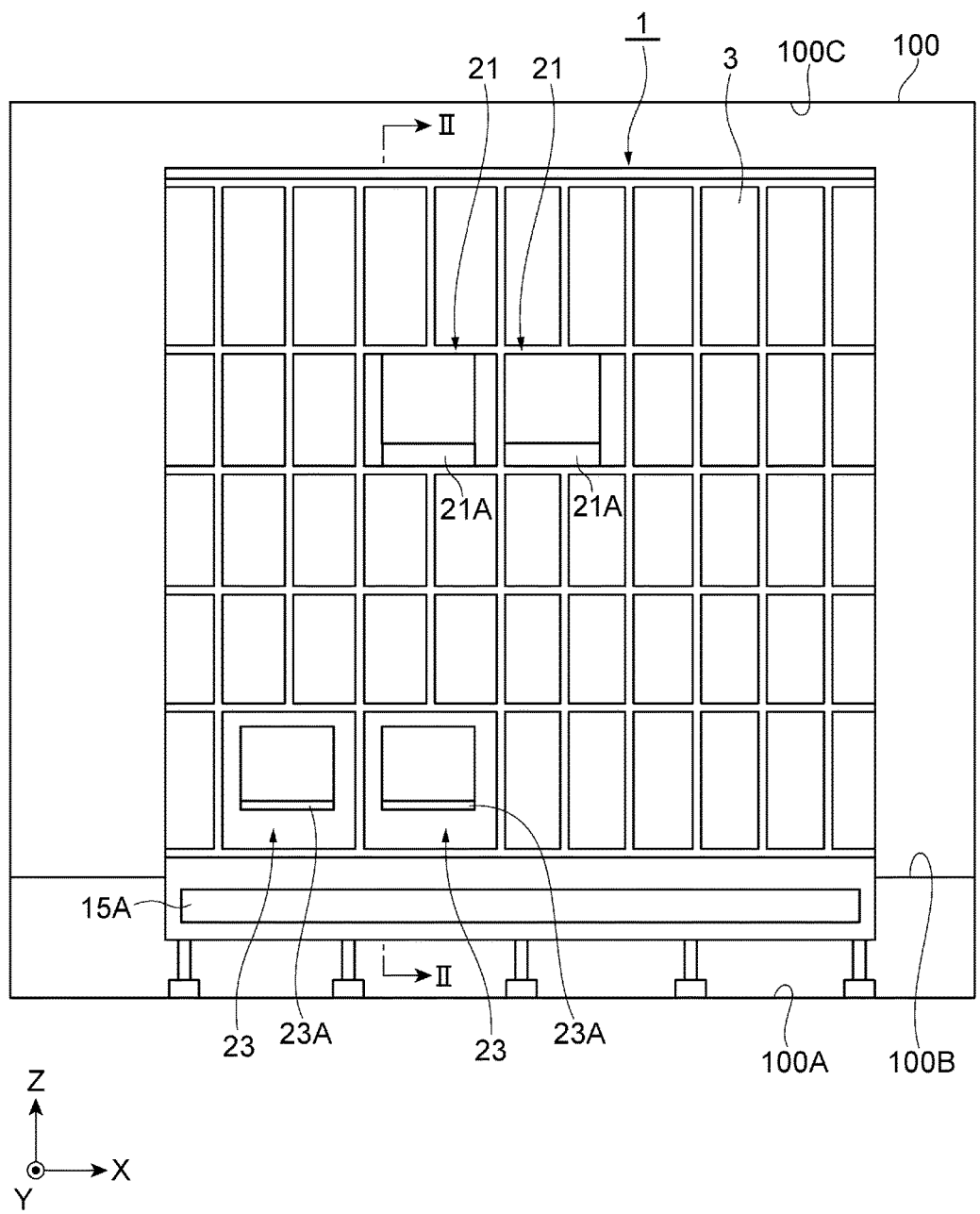
FIG. 1 is a front view showing a purge stocker equipped with a purge device according to a preferred embodiment of the present invention.
Figure 2:
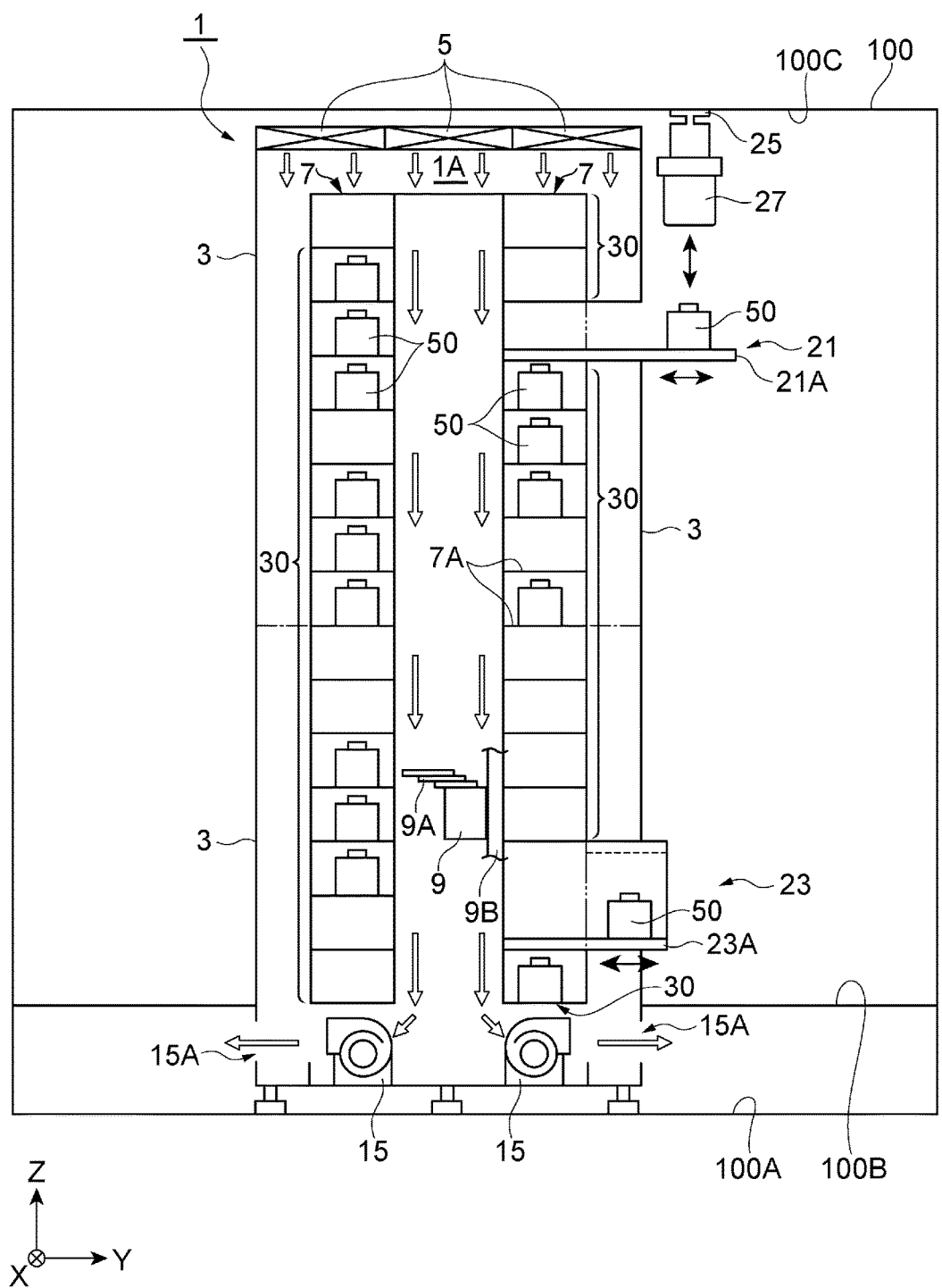
FIG. 2 is a cross-sectional view of the purge stocker taken along the line II-II of FIG. 1.

A purge device 30 (refer to FIG. 4) according to a preferred embodiment of the present invention is described below. The purge device 30 performs a purge process in which an inside 54 of a storage container 50 (refer to FIGS. 3A and 3B) such as a FOUP (Front Opening Unified Pod), where an article such as a semiconductor wafer or a glass substrate is accommodated, is purged with a purge gas. As illustrated in FIGS. 1 and 2, the purge device 30 is provided in, for example, a purge stocker 1 that stores the storage container 50 accommodating the article to be accommodated. The purge stocker 1 is, for example, installed in a clean room 100.

As shown in FIGS. 1 and 2, the clean room 100 includes a first floor 100A and a second floor 100B. The second floor 100B functions as a floor used for an operator to move around and also as a section to separate the clean room 100 into two areas. The area sandwiched between the first floor 100A and the second floor 100B is generally an area where an operator is not allowed to enter, various devices, pipes and cables are allocated, and the purge gas is discharged from an exhaust port 15A described later. The second floor 100B may also include a grating plate or a punching plate, for example.

The purge stocker 1 installed in such a clean room 100 is equipped with a partition 3, a FFU (Fan Filter Unit) 5, a rack 7, a crane 9, an exhaust port 15A, an OHT (Overhead Hoist Transfer) port 21 and a manual port 23.

The partition 3 is a cover plate of the purge stocker 1, is a section to separate (define) an area above the first floor 100A, and includes an storage area 1A located inside. The FFU 5 is a ceiling portion of a space separated by the partition 3. That is, a plurality of FFUs is provided above the storage area 1A along a predetermined direction. The FFU 5 takes in air from the outside of the storage area 1A into the storage area 1A and blows clean air downward of the storage area 1A. However, the FFU is generally installed on the ceiling of the clean room, so that if the ceiling of the purge stocker is located close to the ceiling of the clean room, the FFU of the clean room may be used. The exhaust port 15A is located in the vicinity of a bottom portion of the storage area 1A, and discharges the purge gas into an area between the first floor 100A and the second floor 100B of the clean room 100. The purge gas is discharged from the storage area 1A by using an exhaust fan 15. That is, one exhaust system (discharge device) preferably includes the FFU 5 and the exhaust fan 15, for example. Hereinafter, such an exhaust system is also referred to as "first exhaust system".

The rack 7 stores the storage container 50 and generally includes one to two rows (here, two rows) set in the storage area 1A. Each rack 7 is extended in a predetermined direction X, and two adjacent racks 7 are placed parallel or substantially parallel to face each other. Each rack 7 includes a plurality of storage shelves 7A, in which the storage container 50 is placed and stored, along a predetermined direction X and a vertical direction.

The crane 9 transports the storage container 50 into and out of the storage shelf 7A, and is located in an area between racks 7, which face each other. The crane 9 runs on a traveling rail (not illustrated) installed on the floor along an extending direction X of the rack 7, thus being able to move in a predetermined direction X along the rack 7. A loading platform 9A on the crane 9 is able to be raised and lowered along a guide rail 9B, and is capable of transporting the storage container 50 into and out of a plurality of storage shelves 7A which are placed in a vertical direction.

The storage container 50 is transported into and out of the purge stocker 1 from the OHT port 21 and the manual port 23. The OHT port 21 is a section where the storage container 50 is transferred between an overhead traveling vehicle (OHT) 27 that runs on a traveling rail 25 placed on a ceiling 100C and the purge stocker 1, and is equipped with a conveyor 21A that transports the storage container 50. The manual port 23 is a section where the storage container 50 is transferred between an operator and the purge stocker 1, and is equipped with a conveyor 23A that transports the storage container 50.

The storage shelf 7A of rack 7 includes the purge device 30 where the inside 54 of the storage container 50 to be placed is purged with the purge gas (nitrogen gas, for example). The purge device 30 supplies and discharges the purge gas into the storage container 50 placed on the storage shelf 7A.

Figure 3A:
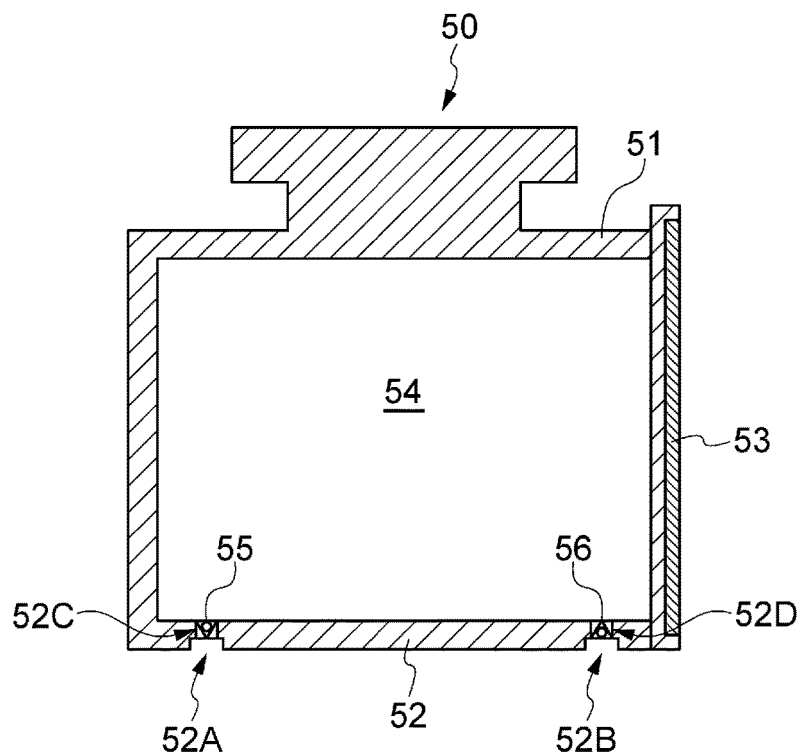
FIG. 3A is a cross-sectional view illustrating a storage container that is subject to a purge process by the purge device of FIG. 1.
Figure 3B:
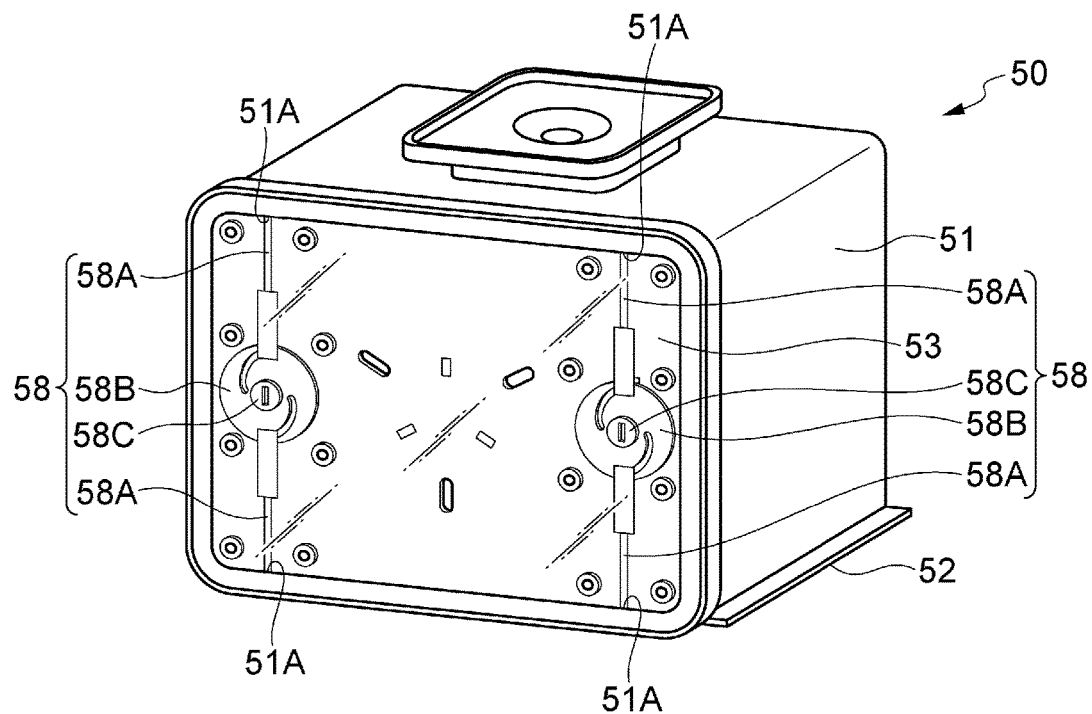
FIG. 3B is a perspective view illustrating the storage container subject to the purge process by the purge device of FIG. 1.

The storage container 50 is described below. As illustrated in FIGS. 3A and 3B, the storage container 50 includes a main body 51 and a lid 53 which defines and functions as a chassis. The storage container 50 includes the inside 54 of the storage container 50 defined by the main body 51 and the lid 53. The inside of the storage container 50 accommodates a plurality of semiconductor wafers (not illustrated).

When the side where the lid 53 is placed is considered to be the front side, a lower surface of a bottom surface 52 defining a bottom portion of the main body 51 has outlets 56, which are provided in the vicinity of both left and right ends on the front side, and inlets 55, which are provided on both left and right ends on the rear side. The inlet 55 includes a connection portion 52A and a communication portion 52C. The outlet 56 includes a connection portion 52B and a communication portion 52D. In this preferred embodiment, the connection portion 52A connects to a supply pipe 31 of the purge device 30 described in detail later. In addition, the connection portion 52B connects to a discharge pipe 33 of the purge device 30. The connection portions 52A, 52B respectively include the communication portions 52C, 52D that have diameters equal or substantially equal to internal diameters of the supply pipe 31 and the discharge pipe 33. The communication portions 52C, 52D are holes that communicate the inside 54 of the storage container 50 with the outside of the storage container 50.

The lid 53 is placed on one of the side surfaces of the main body 51. The lid 53 is provided with, for example, a latch mechanism 58. The latch mechanism 58 includes latch portions 58A and a cam portion 58B. The latch portions 58A have a structure such that when a key is turned in the state wherein the key (not illustrated) is being inserted into an insert port 58C provided on the cam portion 58B, the side ends opposite to the side of the latch portion 58A, where the cam portion 58B is located, insert/withdraw. Furthermore, the lid 53 is fixed to the main body 51 by engaging the ends of the latch portions 58A with grooves 51A provided on the main body 51 that is a surface opposed to the latch portion 58A.

Figure 4:
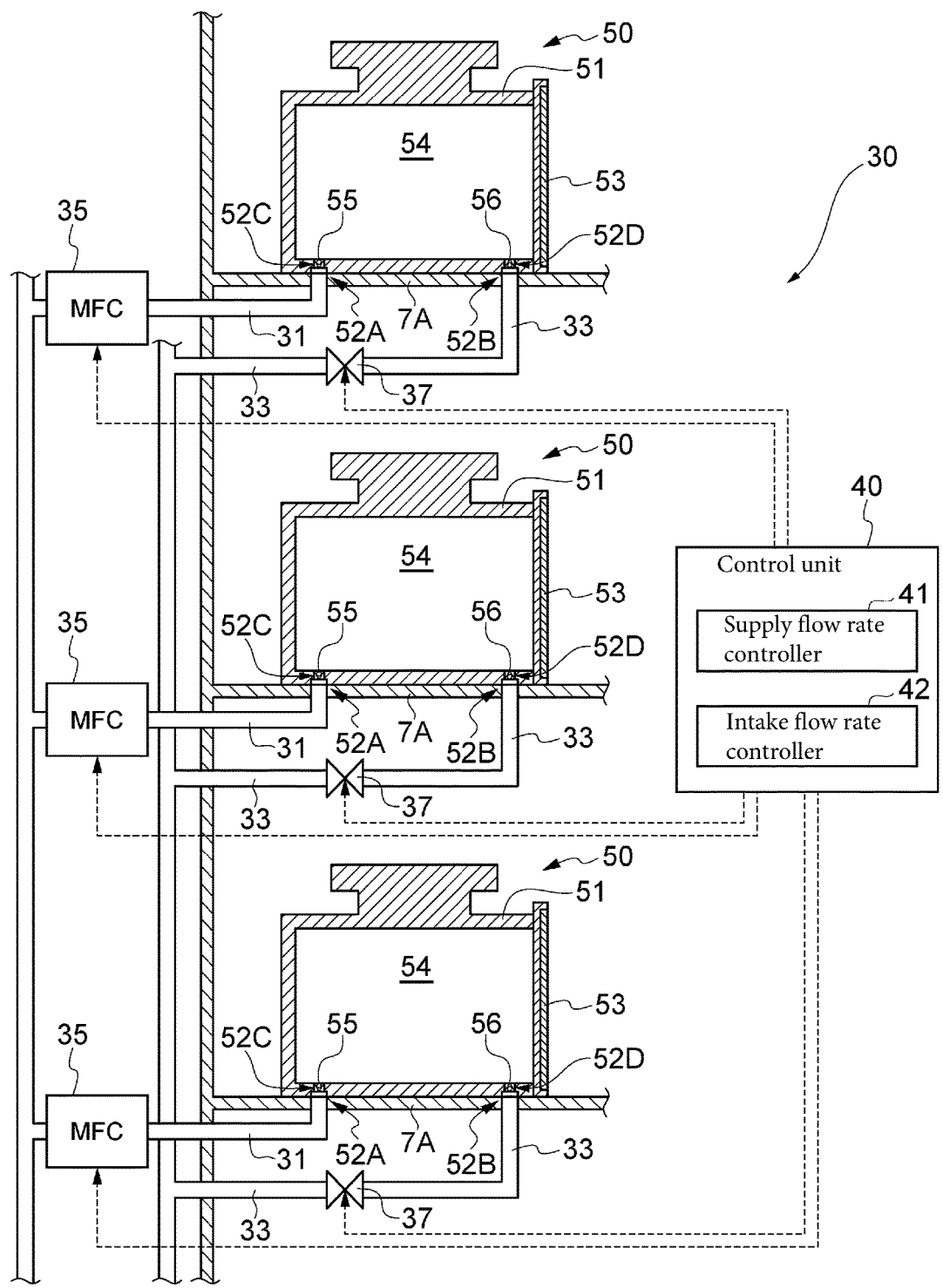
FIG. 4 is a schematic block view illustrating the structure of the purge device of FIG. 1.

The purge device 30, that purges the inside 54 of the storage container 50 with the purge gas (nitrogen gas, for example), will be explained below. As shown in FIG. 4, the purge device 30 includes a supply pipe 31, a MFC/Mass Flow Controller (supply flow rate adjuster) 35, a purge gas source (not illustrated), a discharge pipe 33, a valve (intake flow rate adjuster) 37 and a controller 40.

The tip of the supply pipe 31 is a nozzle and connects to the inlet 55 of the storage container to supply the purge gas into the storage container 50. In the present preferred embodiment, the supply pipe 31 is brought into close contact with the connection portion 52A, thus connecting to the communication portion 52C. The MFC 35 measures the mass flow rate of the purge gas that flows through the supply pipe 31 and controls the flow rate. For the MFC 35 of the present preferred embodiment, the flow rate is controlled by the supply flow rate controller (supply flow rate adjuster) 41 mentioned later. The purge gas source (not illustrated) is a tank that stores the purge gas.

The tip of the discharge pipe 33 is a nozzle and connects to the outlet 56 of the storage container 50 to take in the purge gas in the inside 54 of the storage container 50 and discharge the purge gas in the inside 54 of the storage container 50. In the present preferred embodiment, the discharge pipe 33 is brought into close contact with the connection portion 52B, thus connecting to the communication portion 52D. The valve 37 adjusts the flow rate of the purge gas to be taken in through the discharge pipe 33 in order to prevent the pressure of the inside 54 of the storage container 50 from becoming negative relative to the outside of the storage container 50. The valve 37 may adopt a device with a structure remotely controllable such as an electromagnetic type or an air type. For the valve 37 of the present preferred embodiment, opening and closing the valve is controlled by the intake flow rate controller (intake flow rate adjuster) 42 mentioned later.

As shown in FIG. 4, the discharge pipe 33 in the purge device according to the present preferred embodiment includes the aggregated discharge pipes 33 from a plurality of purge devices 30 and connects to an existing negative pressure exhaust duct via the area between the first floor 100A and the second floor 100B in the clean room 100 (refer to FIGS. 1 and 2). In such a structure, the discharge pipe 33 connecting to each purge device 30 is able to take in the purge gas in the inside 54 of the storage container 50 by connecting to the outlet 56 of the storage containers 50 and discharge the purge gas in the inside 54 of the storage containers 50 via the negative pressure exhaust duct. That is, one exhaust system preferably includes each discharge pipe 33 and the negative pressure exhaust duct. Hereinafter, such an exhaust system is also referred to as "second exhaust system".

The controller 40 is configured or programmed to control various purge processes in the purge device 30 and is an electronic controller that preferably includes a CPU (Central Processing Unit), a ROM (Read Only Memory), a RAM (Random Access Memory), for example. The controller 40, as shown in FIG. 4, preferably is configured or programmed to include the supply flow rate controller 41 and the intake flow rate controller 42 as a conceptual or functional element that runs various control processes of the purge device 30. A function run by such a conceptual or functional element is performed under the control of the CPU or the like.

The supply flow rate controller 41 controls the MFC 35 to adjust the supply flow rate of the purge gas supplied to the storage container 50. The intake flow rate controller 42 performs control so as to close the valve 37 at the time of the first flow rate and open the valve 37 at the time of the second flow rate. The "first flow rate" refers to a flow rate lower than the predetermined flow rate F1 in the storage container 50 that has a risk of rendering the pressure of the inside 54 of the storage container 50 negative relative to the outside of the storage container 50 when the flow rate of the purge gas supplied to the storage container 50 becomes lower than the predetermined flow rate F1 in the state wherein the storage container 50 is connected to the supply pipe 31 and the discharge pipe 33. Furthermore, the "second flow rate" refers to a flow rate higher than the first flow rate.

A purge process operation (purge method) in the purge device 30 will be explained below. Once the controller 40 detects the placement of the storage container 50 (or a user inputs a purge process command), it starts supplying the purge gas into the storage container 50 (purge process). At that time, the supply flow rate controller 41 controls the MFC 35 so as to supply the purge gas into the storage container 50 at the prescribed flow rate (supply flow rate adjustment step). At least two flow rates are able to be inputted as the prescribed flow rate and are accordingly set and inputted in advance by an operator. The intake flow rate controller 42 controls opening and closing the valve 37 in order to prevent the pressure of the inside 54 of the storage container 50 from becoming negative relative to the outside of the storage container 50. Generally, once the MFC 35 starts supplying the purge gas, the valve 37 is opened, and once the MFC 35 stops supplying the purge gas, the valve 37 is closed (intake flow rate adjustment step).

However, in accordance with conditions (for example, storage container's characteristics, purge device's characteristics and supply flow rate), the pressure of the inside 54 of the storage container 50 may become negative relative to the outside of the storage container 50 even though the MFC 35 has started supplying the purge gas. Thus, the following control will be taken for the storage container 50 that has a risk of rendering the pressure of the inside 54 of the storage container 50 negative relative to the outside of the storage container 50 when the flow rate of the purge gas supplied to the storage container 50 becomes lower than the predetermined flow rate in the state wherein the storage container 50 is connected to the supply pipe 31 and the discharge pipe 33. That is, the intake flow rate controller 42 controls so as to close the valve 37 at the time of the first flow rate, which is lower than the predetermined flow rate, and open the valve 37 at the time of the second flow rate, which is higher than the first flow rate.

Advantageous effects of the purge device 30 according to the present embodiment will be explained. According to the purge device 30 of the present preferred embodiment, the purge gas in the inside 54 of the storage container 50 is taken in from the discharge pipe 33, so that the amount of the purge gas leaking from the inlet 55 or a space between the main body 51 and the lid 53 (a section other than the outlet) in storage container 50 is significantly reduced. Additionally, according to the purge device 30 of the present preferred embodiment, opening and closing the valve 37 is controlled so as to prevent the pressure of the inside 54 of the storage container 50 from becoming negative relative to the outside of the storage container 50. This prevents contaminated air and dust from being sucked into the inside 54 of the storage container 50 from the outside of the storage container 50. This results in significantly reducing the amount of the purge gas leaking into the storage area 1A where the purge device 30 is placed, eventually reducing the amount of the purge gas leaking from the storage area 1A, and also preventing contaminated air and dust from being sucked into the inside 54 of the storage container 50.

Here, the case in which the purge gas leaks from the storage area 1A refers to a situation in which the purge gas is discharged from, for example, the OHT port 21 and the manual port 23 which are openings of the storage area 1A without being inductively discharged from the exhaust port 15A.

Additionally, the purge device 30 according to the present preferred embodiment includes the MFC 35 that changes the flow rate of the purge gas supplied to the storage container 50 through the supply pipe 31, so that the purge gas is able to be supplied into the storage container 50 in various patterns. The purge gas is able to be supplied according to various needs, for example, when it is preferred that a relatively high flow rate of the purge gas is supplied into the storage container 50 to ensure immediate effect of the purge process or when it is preferred that a relatively low flow rate of the purge gas is continuously supplied into the storage container 50 after cleanliness has been achieved sufficiently.

Additionally, in the purge device 30 according to the present preferred embodiment, if the supply flow rate is a relatively low first flow rate even in the case that the supply flow rate of the purge gas has been changed as mentioned above, the intake flow rate will be set to zero. Thus, it is possible to adjust so as to prevent the pressure of the inside 54 of the storage container 50 from becoming negative relative to the outside of the storage container 50.

Figure 5:
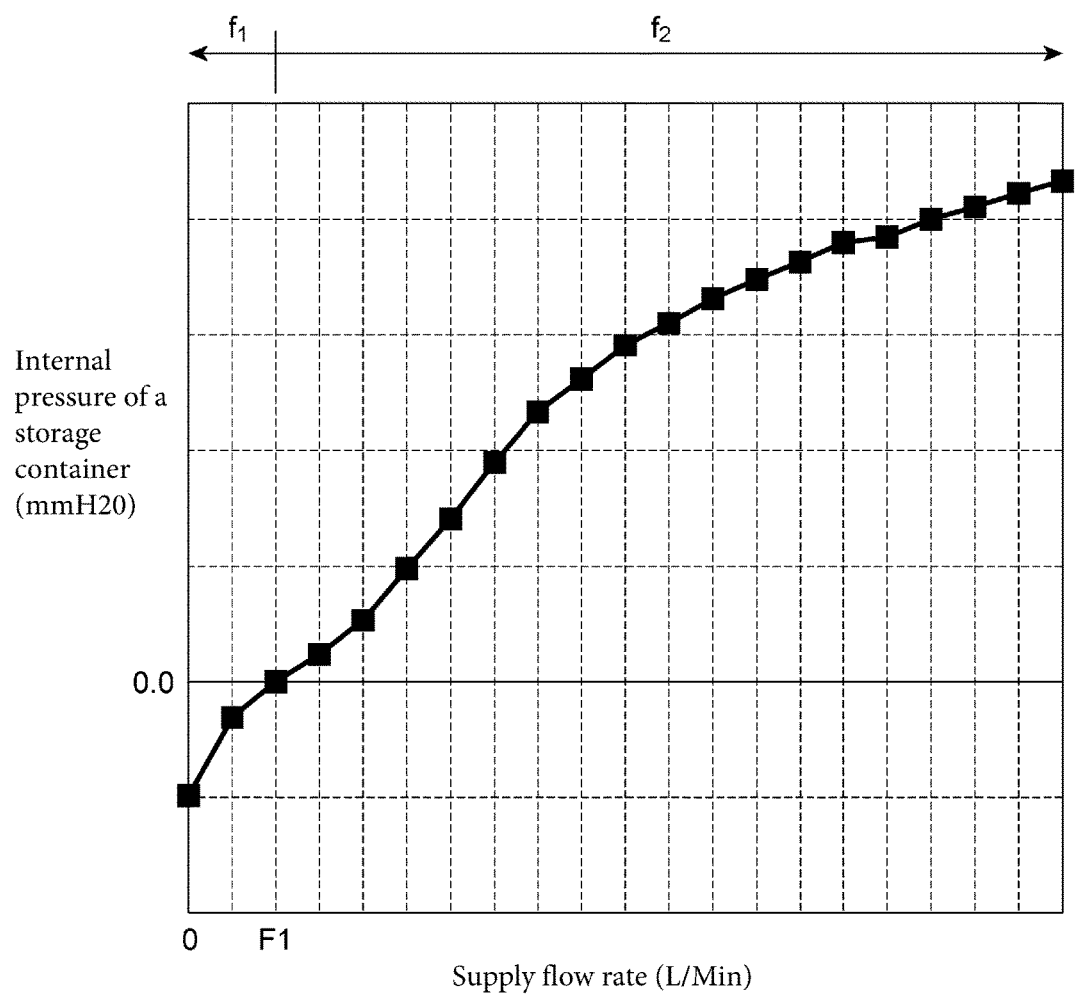
FIG. 5 is a graph showing the relationship between a supply flow rate of a purge gas and an internal pressure of the storage container when the inside of the storage container is purged while connecting to a discharge pipe.

Additionally, as a result of earnest examination, the inventors of the present application discovered that the pressure of the inside 54 of the storage container becomes negative relative to the outside of the storage container despite the purge gas being supplied to the storage container 50. That is, as shown in FIG. 5, when the flow rate of the purge gas supplied to the storage container 50 is relatively low (predetermined flow rate F1), the inventors discovered that the pressure of the inside 54 of the storage container 50 becomes negative relative to the outside of the storage container 50.

Thus, in the purge device 30 according to the present preferred embodiment, when the flow rate of the purge gas supplied to the storage container 50 becomes lower than the predetermined flow rate F1 in the state wherein the storage container 50 is connected to the supply pipe 31 and the discharge pipe 33, the following control preferably is performed for the storage container 50 that has a risk of rendering the pressure of the inside 54 of the storage container 50 negative relative to the outside of the storage container 50. That is, when the flow rate lower than the predetermined flow rate F1 is considered as the first flow rate f1 and the flow rate higher than the first flow rate f1 is considered as the second flow rate f2, control is performed so that the valve 37 is closed at the time of the first flow rate f1 and opened at the time of the second flow rate f2.

Additionally, according to the purge device 30 with this structure, even when the flow rate of the purge gas supplied to the storage container 50 has been changed, opening and closing the valve 37 is controlled so as to prevent the pressure of the inside 54 of the storage container 50 from becoming negative relative to the outside of the storage container 50. This prevents contaminated air and dust from being sucked into the inside 54 of the storage container 50 from the outside of the storage container 50.

Additionally, the purge device 30 with such a structure includes the first exhaust system (the FFU 5 and the exhaust fan 15) that ventilates and discharges the purge gas leaked from the inlet 55 or the space between the main body 51 and the lid 53 of the storage container 50 to the outside of the storage container 50, so that the purge gas that has leaked from the storage container 50 is significantly reduced or prevented from leaking from the storage area 1A of the purge stocker 1. This is particularly effective when the purge gas is supplied at the predetermined flow rate F1 or lower. In the purge device 30 of the present preferred embodiment, when the supply flow rate of the purge gas supplied to the storage container 50 is the predetermined flow rate F1 or lower, the valve 37 is closed because the purge gas may leak from the inlet 55 or the space between the main body 51 and the lid 53 of the storage container 50.

That is, when the flow rate of the purge gas supplied to the storage container 50 is the predetermined flow rate F1 or lower, the purge gas is discharged from the inlet 55 or the space between the main body 51 and the lid 53, recovered by using only the first exhaust system, and discharged to the outside of the purge stocker 1 in order to prevent the inside 54 of the storage container 50 from becoming negatively pressured. When the flow rate of the purge gas supplied to the storage container 50 is higher than the predetermined flow rate F1, the purge gas is discharged to the outside of the purge stocker 1 by using both the first and second exhaust systems.

An explanation of preferred embodiments of the present invention is provided above. However, the present invention is not limited to the above-described preferred embodiments, and various alterations may be made within the scope of the present invention.

First Alternative Preferred Embodiment

In the above-described preferred embodiments, for example, a location where each discharge pipe 33 is connected to the negative pressure exhaust duct, preferably is used to provide an explanation, however the present invention is not limited to this. For example, an intake device may be separately provided. Even in this case, the discharge pipe 33 connected to each purge device 30 is connected to the outlet 56 of the storage container 50 to take in the purge gas of the inside 54 of the storage container 50 and then discharge the purge gas of the inside 54 of the storage container 50.

Second Alternative Preferred Embodiment

In the above-described preferred embodiments, the purge device 30 is illustrated using the example of the first exhaust system, however the present invention is not limited to this. For example, when the amount of the purge gas leaking from the inlet 55 or the space between the main body 51 and the lid 53 of the storage container 50 is relatively small, the purge device may not include the first exhaust system.

Other Alternative Preferred Embodiments

In the above-described preferred embodiments, the example of the purge device arranged in the purge stocker 1 was used to provide an explanation, however the present invention is not limited to this. This can be applied to not only the purge device arranged in the space defined by the partition 3 or the like but also the purge device mounted on a relay point between the overhead traveling vehicles, a transfer point from the conveyor to the overhead traveling vehicle (load port), or a ceiling buffer, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A purge method of performing a purge process where an inside of a storage container, in which an article is accommodated, is purged with a purge gas, the purge method comprising the steps of:
adjusting a supply flow rate of the purge gas supplied to the storage container; and
adjusting an intake flow rate of the purge gas taken in from the inside of the storage container to prevent a pressure of the inside of the storage container from becoming negative relative to an outside of the storage container; wherein
in the step of adjusting the supply flow rate, the supply flow rate is adjusted in at least two stages including a first flow rate and a second flow rate that is higher than the first flow rate; and
in the step of adjusting the intake flow rate, the intake flow rate is adjusted to zero in response to the supply flow rate being the first flow rate.

2. A purge device that performs a purge process in which an inside of a storage container, where an article is accommodated, is purged with a purge gas, the purge device comprising:
a supply pipe that supplies the purge gas into the storage container by being connected to the storage container;
a supply flow rate adjuster that adjusts a supply flow rate of the purge gas supplied to the storage container through the supply pipe;
a discharge pipe that discharges the purge gas in the inside of the storage container by being connected to the storage container; and
an intake flow rate adjuster that adjusts an intake flow rate of the purge gas taken in from the inside of the storage container through the discharge pipe; wherein
the supply flow rate adjuster is able to adjust the supply flow rate in at least two stages including a first flow rate and a second flow rate that is higher than the first flow rate; and
the intake flow rate adjuster sets the intake flow rate to zero in response to the supply flow rate being the first flow rate.

3. The purge device according to claim 2, wherein the intake flow rate adjuster includes:
a valve that is provided in the discharge pipe; and
an intake flow rate controller that controls opening and closing the valve; wherein
the intake flow rate controller performs control to close the valve in response to the supply flow rate being the first flow rate and open the valve in response to the supply flow rate being the second flow rate.

4. The purge device according to claim 2, further comprising a discharge device that includes an exhaust fan and discharges the purge gas leaked from a section other than an outlet, which the discharge pipe is connected to in the storage container, to the outside of the storage container.

* * * * *